United States Patent [19]

Sugata et al.

[11] Patent Number: 4,783,369

[45] Date of Patent: Nov. 8, 1988

[54] HEAT-GENERATING RESISTOR AND HEAT-GENERATING RESISTANCE ELEMENT USING SAME

[75] Inventors: Masao Sugata, Yokohama, Japan; Tatsuo Masaki, deceased, late of Yokohama, Japan, by Yoshiko Masaki, legal representative; Hirokazu Komuro; Shinichi Hirasawa, both of Hiratsuka; Yasuhiro Yano, Kawasaki, all of Japan

[73] Assignee: Canon Kabushiki Kaisha, Tokyo, Japan

[21] Appl. No.: 842,118

[22] Filed: Mar. 20, 1986

[30] Foreign Application Priority Data

| Mar. 23, 1985 | [JP] | Japan | 60-58842 |
| Mar. 25, 1985 | [JP] | Japan | 60-58523 |
| Mar. 25, 1985 | [JP] | Japan | 60-58524 |
| Mar. 25, 1985 | [JP] | Japan | 60-58525 |
| Mar. 25, 1985 | [JP] | Japan | 60-58526 |
| Mar. 26, 1985 | [JP] | Japan | 60-59384 |
| Mar. 26, 1985 | [JP] | Japan | 60-59385 |
| Mar. 26, 1985 | [JP] | Japan | 60-59386 |
| Mar. 26, 1985 | [JP] | Japan | 60-59387 |
| Mar. 27, 1985 | [JP] | Japan | 60-60534 |

[51] Int. Cl.⁴ .................. B32B 9/00; H01C 1/012; H05B 3/10
[52] U.S. Cl. .................. 428/408; 219/553; 338/308; 338/314
[58] Field of Search .......... 428/408; 427/39; 338/308, 309, 314; 252/502; 219/553

[56] References Cited

U.S. PATENT DOCUMENTS

| 2,671,735 | 3/1954 | Grisdale et al. | 338/308 X |
| 2,778,743 | 1/1957 | Bowman | 338/308 X |
| 3,292,130 | 12/1966 | Roques | 338/308 |
| 3,301,707 | 1/1967 | Loeb et al. | 428/220 |
| 3,390,452 | 7/1968 | Huang | 338/308 X |
| 3,604,970 | 9/1971 | Culbertson et al. | 427/39 |
| 3,639,165 | 2/1972 | Rairden | 428/433 |
| 3,645,783 | 2/1972 | Rupert et al. | 428/209 |
| 3,882,363 | 5/1975 | Miscencik | 219/502 X |
| 3,938,526 | 2/1976 | Anderson et al. | 219/221 X |
| 4,036,786 | 7/1977 | Tiedeman | 252/511 |
| 4,060,660 | 11/1977 | Carlson et al. | 428/408 |
| 4,172,718 | 10/1979 | Menzel | 148/403 |
| 4,296,309 | 10/1981 | Shinimi et al. | 219/216 |
| 4,361,638 | 11/1982 | Higashi et al. | 427/39 |
| 4,400,410 | 8/1983 | Green et al. | 427/39 |
| 4,414,274 | 11/1983 | Hieber | 428/336 |
| 4,436,797 | 3/1984 | Brady et al. | 428/408 |
| 4,522,663 | 6/1985 | Ovshinsky et al. | 427/39 |
| 4,567,493 | 1/1986 | Ikeda et al. | 346/140 R |
| 4,568,626 | 2/1986 | Ogawa | 427/39 |
| 4,585,704 | 4/1986 | Hiral | 428/446 |
| 4,597,844 | 7/1986 | Hiraki | 428/408 |
| 4,629,514 | 12/1986 | Suda | 148/1.5 |

FOREIGN PATENT DOCUMENTS

| 0071082 | 2/1983 | European Pat. Off. |
| 3411702 | 10/1984 | Fed. Rep. of Germany |
| 3316182 | 11/1984 | Fed. Rep. of Germany |
| 3041420 | 1/1985 | Fed. Rep. of Germany |
| 49521 | 5/1981 | Japan | 427/39 |
| 42472 | 3/1983 | Japan |
| 42473 | 3/1983 | Japan |
| 1410876 | 10/1975 | United Kingdom |
| 1582231 | 1/1981 | United Kingdom |
| 2083841 | 3/1982 | United Kingdom |
| 2109012 | 5/1983 | United Kingdom |

Primary Examiner—John E. Kittle
Assistant Examiner—Susan S. Rucker
Attorney, Agent, or Firm—Fitzpatrick, Cella, Harper & Scinto

[57] ABSTRACT

A heat generating resistor having a functional thin film comprising an amorphous material containing halogen atoms and hydrogen atoms non-uniformly distributed in a matrix of carbon atoms formed on a substrate. Optionally, the thin film also contains silicon and/or germanium, and a substance for controlling the electroconductivity of the thin film. The optional ingredients are also non-uniformly distributed within the thin film.

29 Claims, 4 Drawing Sheets

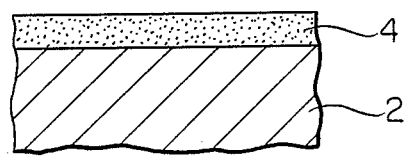
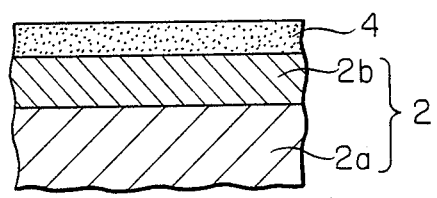
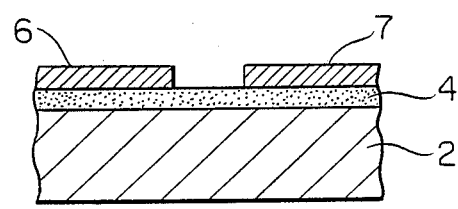

HEAT-GENERATING RESISTOR AND HEAT-GENERATING RESISTANCE ELEMENT USING SAME

BACKGROUND OF THE INVENTION

1. Field of the Invention

This invention relates to a heat-generating resistor and a heat-generating resistance element by use of the heat-generating resistor, particularly to a thin film heat-generating resistor having a resistance thin film as the functional element on a substrate surface and a heat-generating resistance element by use of the heat-generating resistor.

Such a resistor can be used suitably as an electricity-to-heat energy converting element in various electronic instruments and electrical instruments.

2. Description of the Prior Art

In the prior art, the heat-generating resistors employed as relatively small electricity-to-heat energy converting elements in electronic instruments or electrical instruments may include the thin film type, the thick film type and the semiconductor type. Among them, the thin film type can be smaller in power consumption as compared with other types and also relatively better in heat response, and therefore tends to be increasingly applied.

The performances demanded for such a heat-generating resistor are good response of heat generation to a certain electrical signal, good thermal conductivity, good heat resistance to heat generation by itself and various durabilities (e.g. durability against heat history).

And, in the thin film type heat-generating resistors, the above performances have not been satisfactory and further improvements of the characteristics are desired.

SUMMARY OF THE INVENTION

In view of the prior art as described above, an object of the present invention is to provide a thin film heat-generating resistor improved in heat response and a heat-generating resistance element employing the resistor.

Another object of the present invention is to provide a thin film heat-generating resistor improved in thermal conductivity and a heat-generating resistance element employing the resistor.

Still another object of the present invention is to provide a thin film heat-generating resistor improved in heat resistance and a heat-generating resistance element employing the resistor.

Still another object of the present invention is to provide a thin film heat-generating resistor improved in durability and a heat-generating resistance element employing the resistor.

It is also another object of the present invention to provide a thin film heat-generating resistor improved in chemical resistance, flexibility and mechanical characteristics and a heat-generating resistance element employing the resistor.

Further object of the present invention is to provide a heat-generating resistor which has made various characteristics such as heat accumulability, heat dissipatability, adhesion of the substrate to the functional thin film easily realizable, and a heat-generating resistance element employing the resistor.

BRIEF DESCRIPTION OF THE DRAWINGS

FIG. 1 and FIG. 2 are partial sectional views of the heat-generating resistor of the present invention.

FIG. 4 is a partial sectional view of the heat-generating resistance element prepared in Example 1 of the present invention.

DETAILED DESCRIPTION OF THE PREFERRED EMBODIMENTS

Figure 3:
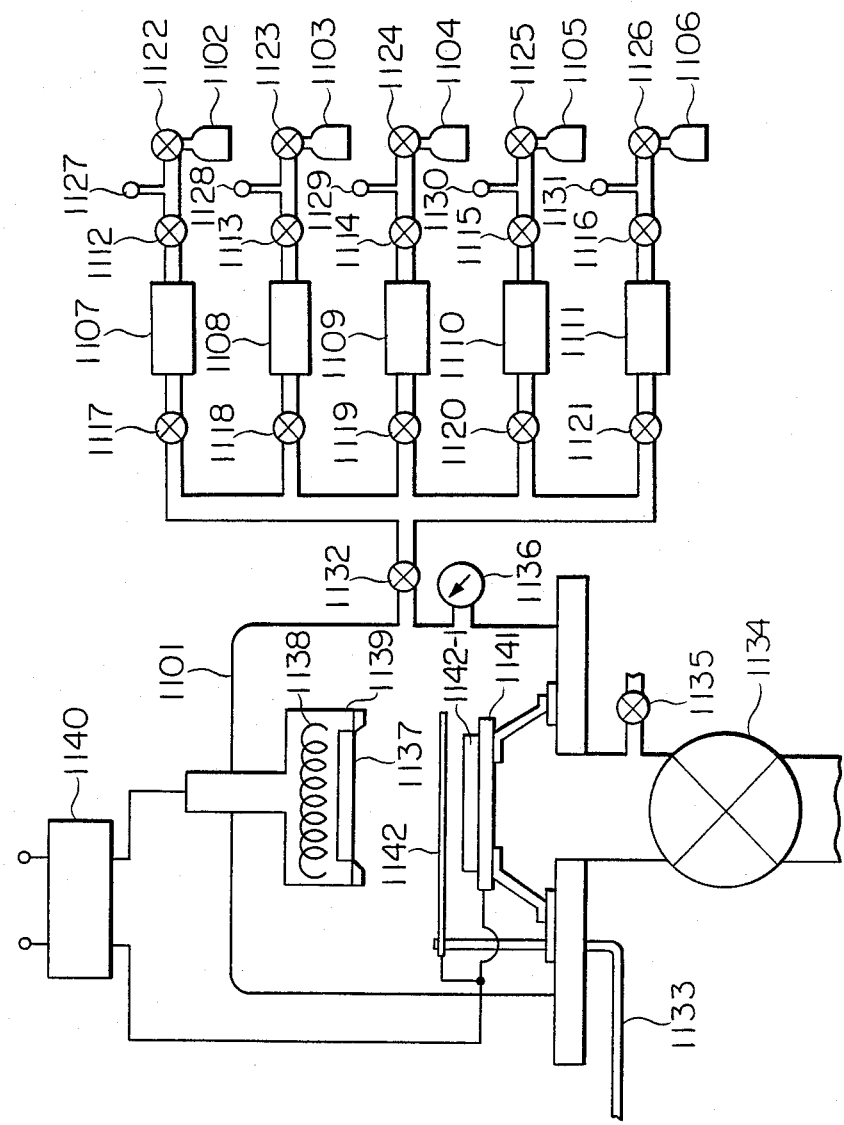
FIG. 3 is an illustration of the device to be used for preparation of the heat-generating resistor of the present invention.
Figure 5:
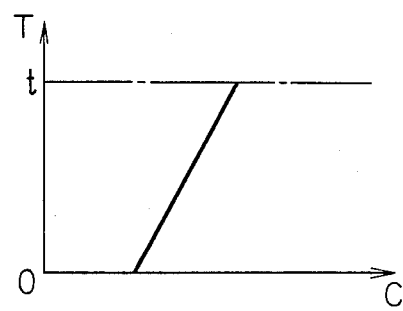
FIG. 5 to FIG. 10 are graphs showing distribution of the content of a substance selected from halogen atoms, hydrogen atoms, silicon atoms, germanium atoms and substances for controlling electroconductivity in the functional thin film.
Figure 6:
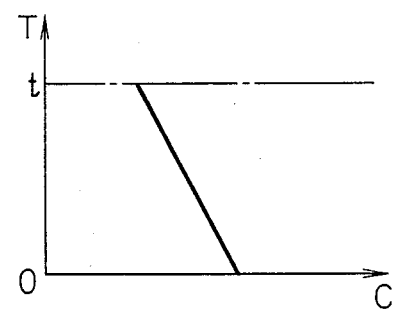
Figure 7:
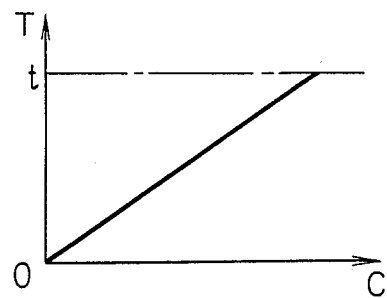
Figure 8:
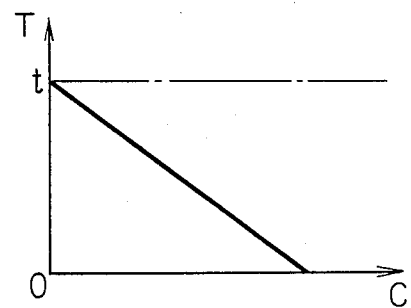
Figure 9:
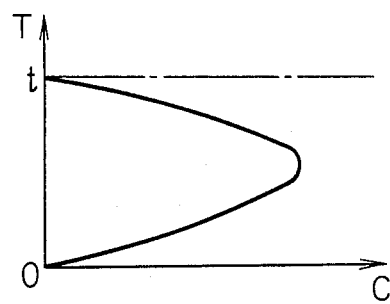
Figure 10:
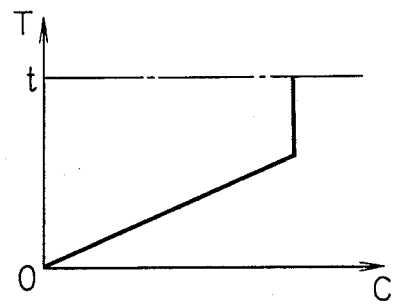

Referring now to the drawings, the present invention is described in more detail.

FIG. 1 is a partial sectional view showing the construction of an embodiment of the heat-generating resistor of the present invention.

In this FIG. 2 is a substrate and 4 is a thin film for realizing functionality, namely resistance.

The material for the substrate 2 is not particularly limited in the present invention, but it is practically preferable to use a material which has good adhesion to the functional thin film to be formed on its surface, and also has good resistance to heat during formation of the functional thin film 4 and to the heat generated on the functional thin film during usage. Also, the substrate 2 should preferably have an electrical resistance greater than the functional thin film to be formed on its surface. Further, in the present invention, depending on the purpose of use of the resistor, a substrate 2 with small thermal conductivity or great thermal conductivity may be used.

Examples of the substrate 2 to be used in the present invention may include those comprising inorganic materials such as glass, ceramic, silicon, etc. and organic materials such as polyamide resin, polyimide resin, etc.

In the present invention, the functional thin film 4 comprises an amorphous material containing halogen atoms and hydrogen atoms in a matrix of carbon atoms. As halogen atoms, F, Cl, Br, I and the like can be utilized, and these may be used either singularly or in combination. As halogen atoms, particularly F and Cl are preferred, and above all F is preferred.

The content of halogen atoms in the functional thin film 4 may be suitably selected depending on the purpose of use of the resistor so that desired characteristics may be obtained, but it is preferably 0.0001 to 30 atomic %, more preferably 0.0005 to 20 atomic %, optimally 0.001 to 10 atomic %.

The content of hydrogen atoms in the functional thin film 4 may be suitably selected depending on the purpose of use of the resistor so that desired characteristics may be obtained, but it is preferably 0.0001 to 30 atomic %, more preferably 0.0005 to 20 atomic %, optimally 0.001 to 10 atomic %.

The sum of the content of halogen atoms and hydrogen atoms in the functional thin film 4 may be suitably selected depending on the purpose of use of the resistor so that desired characteristics may be obtained, but it is preferably 0.0001 to 40 atomic %, more preferably 0.0005 to 30 atomic %, optimally 0.001 to 20 atomic %.

The functional thin film 4 comprising an amorphous material containing halogen atoms and hydrogen atoms in a matrix of carbon atoms (hereinafter sometimes abbreviated as "a-C:(X,H)" wherein X represents a halogen atom) in the heat-generating resistor of the present invention can be formed according to a plasma CVD method such as the glow discharge method or a vacuum deposition method such as the sputtering method.

For example, for formation of the thin film 4 comprising a-C:(X,H) according to the glow discharge method, the basic process may comprise arranging the substrate 2 in a deposition chamber under reduced pressure, introducing a starting gas for C supply capable of supplying carbon atoms (C), a starting gas for X supply capable of supplying halogen atoms (X) and a starting gas for H supply capable of supplying hydrogen atoms (H) into the deposition chamber and exciting glow discharging by use of high frequency or microwave is the deposition chamber thereby to form a layer comprising a-C:(X,H) on the surface of the substrate 2. Also, by changing, for example, the amounts of the starting gas for X supply and/or the starting gas for H supply during formation of the a-C:(X,H) layer, the contents of halogen atoms (X) and/or hydrogen atoms (H) in the layer thickness direction can be changed.

On the other hand, for formation of the thin film comprising a-C:(X,H) according to the sputtering method, the basic process may comprise arranging the substrate 2 in a deposition chamber under reduced pressure and introducing a starting gas for X supply and a starting gas for H supply into the deposition chamber in carrying out sputtering of a target constituted of C in an atmosphere of an inert gas such as Ar, He or the like or a gas mixture based on these gases in the deposition chamber. Also, when it is desired to change the contents of X and/or H in the layer thickness direction, for example, the amounts of the starting gas for X supply and/or the starting gas for H supply introduced into the deposition chamber may be changed.

In the present invention, for the purpose of increasing mechanical strength of the functional thin film 4, silicon atoms may also be contained in addition to the above hydrogen atoms and halogen atoms.

Alternatively, for the purpose of increasing the flexibility of the functional thin film 4, germanium atoms may also be contained in place of the silicon atoms as mentioned above.

Further, for the purpose of improving mechanical characteristics, chemical resistance and flexibility of the functional thin film 4, silicon atoms and germanium atoms may also be contained in addition to the above hydrogen atoms and halogen atoms.

The content of silicon atoms or germanium atoms in such a functional thin film 4 may be selected suitably so that desired characteristics may be obtained depending on the purpose of use of the resistor, but it may preferably be 0.0001 to 40 atomic %, more preferably 0.0005 to 20 atomic %, optimally 0.001 to 10 atomic %. Also in this case, halogen atoms and hydrogen atoms may be contained within the ranges of contents as specified above.

On the other hand, the sum of the content of silicon atoms and/or germanium atoms, the content of halogen atoms and the content of hydrogen atoms in the functional thin film 4 may be selected suitably so that desired characteristics may be obtained depending on the purpose of use of the resistor, but it may preferably be 0.0001 to 40 atomic %, more preferably 0.0005 to 30 atomic %, optimally 0.001 to 20 atomic %.

The functional thin film 4 comprising an amorphous material containing silicon atoms, halogen atoms and hydrogen atoms in a matrix of carbon atoms (hereinafter sometimes abbreviated as "a-C:Si:(X,H)"; here X represents a halogen atom) in the heat-generating resistor of the present invention can be also formed according to a plasma CVD method such as the glow discharge method or a vacuum deposition method such as the sputtering method, similarly as described above.

The functional thin film 4 comprising an amorphous material containing germanium atoms, halogen atoms and hydrogen atoms in a matrix of carbon atoms (hereinafter sometimes abbreviated as "a-C:Ge:(X,H)"; here X represents a halogen atom) in the heat-generating resistor of the present invention can be formed also according to a vacuum deposition method, similarly as described above.

Alternatively, the functional thin film 4 comprising an amorphous material containing silicon atoms, germanium atoms, halogen atoms and hydrogen atoms in a matrix of carbon atoms (hereinafter sometimes abbreviated as "a-C:Si:Ge:(X,H)"; here X represents a halogen atom) in the heat-generating resistor of the present invention can be formed also according to a vacuum deposition method, similarly as described above.

For example, for formation of a thin film 4 comprising a-C:Si:(X,H) according to the glow discharge method, a starting gas for Si supply capable of supplying silicon atoms (Si) can be supplied in addition to the starting gas for supply of halogen atoms (X) and the starting gas for supply of hydrogen atoms (H) to form a layer comprising a-C:Si:(X,H) on the surface of the substrate 2.

Also, in the case of forming a thin film 4 comprising a-C:Si(X,H) according to the sputtering method, film formation can be done by introducing further a starting gas for Si supply into the deposition chamber.

For formation of a thin film 4 comprising a-C:Ge:(X,H), for example, in the above vapor deposition method, a starting gas capable of supplying germanium atoms (Ge) may be introduced in place of the starting gas for Si supply.

For formation of a thin film comprising a-C:Si:Ge:(X,H), for example, in the vapor deposition method as described above, it can be formed by introducing a starting gas for Si supply and a starting gas for Ge supply in addition to the starting gas for X supply and the starting gas for H supply.

In the above processes, as the starting gases such as the starting gas for C supply, the starting gas for X supply, the starting gas for H supply, etc., substances gaseous under normal temperature and normal pressure or otherwise those gasifiable under reduced pressure can be used.

The starting material for C supply may include, for example, saturated hydrocarbons having 1 to 5 carbon atoms, ethylenic hydrocarbons having 2 to 5 carbon atoms, acetylenic hydrocarbons having 2 to 4 carbon atoms, specifically saturated hydrocarbons such as methane ($CH_4$), ethane ($C_2H_6$), propane ($C_3H_8$), n-butane (n-$C_4H_{10}$), pentane ($C_5H_{12}$); ethylenic hydrocarbons such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons such as acetylene ($C_2H_2$), methylacetylene ($C_3H_4$), butyne ($C_4H_6$);

aromatic hydrocarbons such as benzene ($C_6H_6$) or the like.

The starting material for X supply may include, for example, halogens, halides, interhalogen compounds, halo-substituted hydrocarbon derivatives, specifically halogens such as $F_2$, $Cl_2$, $Br_2$, $I_2$; halides such as HF, HCl, HBr, HI; interhalogen compounds such as BrF, ClF, $ClF_3$, $BrF_5$, $BrF_3$, $IF_3$, $IF_7$, ICl, IBr; halo-substituted hydrocarbon derivatives such as $CF_4$, $CHF_3$, $CH_2F_2$, $CH_3F$, $CCl_4$, $CHCl_3$, $CH_2Cl_2$, $CH_3Cl$, $CBr_4$, $CHBr_3$, $CH_2Br_2$, $CH_3Br$, $CI_4$, $CHI_3$, $CH_2I_2$, $CH_3I$; and the like.

The starting gas for H supply may include, for example, hydrogen gas and hydrocarbons such as saturated hydrocarbons, ethylenic hydrocarbons, acetylenic hydrocarbons, aromatic hydrocarbons, etc. which are also the above starting materials for C supply.

The starting gas for Si supply may include, for example, hydrogenated silicon (silanes) such as $SiH_4$, $Si_2H_6$, $Si_3H_8$, $Si_4H_{10}$ and the like; halogenated silicon (silane derivatives substituted with halogen atoms) such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Cl_3F_3$ and the like.

The starting gas for Ge supply may include, for example, hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$ and the like; halogenated germanium (hydrogenated germanium derivatives substituted with halogen atoms) such as $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Cl_3F_3$ and the like.

These starting materials may be used either singularly or in combination.

In the process for forming a thin film as described above, for controlling the amount of halogen atoms, the amount of hydrogen atoms, the amounts of other substances to be contained and the characteristics of the thin film 4, the substrate temperature, the amounts of the starting gases supplied, the discharging power and the pressure in the deposition chamber are adequately set.

The substrate temperature may preferably be 20° to 1500° C., more preferably 30 to 1200° C., optimally 50 to 1100° C.

The amounts of the starting gases supplied are determined suitably depending on the desired thin film performances and the aimed film forming speed.

The discharging power may preferably be 0.001 to 20 $W/cm^2$, more preferably 0.01 to 15 $W/cm^2$, optimally 0.05 to 10 $W/cm^2$.

The pressure in the deposition chamber may preferably be $10^{-4}$ to 10 Torr, optimally $10^{-2}$ to 5 Torr.

The thin film in the heat-generating resistor obtained by use of the process for forming thin film as described above has characteristics approximate to those of diamond. That is, for example, it has properties of a Vickers hardness of 1800 to 5000, a thermal conductivity of 0.3 to 2 cal/cm.sec.deg, and a resistivity of $10^{-3}$ to $10^6$ ohm.cm. Also, since the thin film in the heat-generating resistor of the present invention contains halogen atoms and hydrogen atoms, film formation can be done with ease.

The resistor of the present invention can also be provided on the functional thin film 4 with a layer having suitable functions such as protection or other functions, as a matter of course.

Having described above with reference to a single substrate 2, the substrate 2 may also be a composite material. An example of such an embodiment is shown in FIG. 2. That is, the substrate 2 comprises a composite material of a base portion 2a and a surface layer 2b, and the substrate material described with reference to the above FIG. 1, for example, can be used as the base portion 2a, while a material having good adhesiveness to the functional thin film 4 to be formed thereon can be used as the surface layer 2b. The surface layer 2b may be constituted of, for example, an amorphous material having a matrix of carbon atoms or an oxide conventionally known in the art. Such a surface layer 2b can be obtained by use of a suitable starting material by depositing it on the base portion 2a according to the process similar to the above-described thin film forming process. Also, the surface layer 2b may be a glaze layer of a conventional glassy material.

Next, a schematic explanation of the process for producing the heat-generating resistor of the present invention is given.

FIG. 3 is an illustration showing an example of the device to be used during formation of the functional thin film on the substrate surface. 1101 is a deposition chamber, 1102 to 1106 are gas bombs, 1107 to 1111 are mass flow controllers, 1112 to 1116 are inflow valves, 1117 to 1121 are outflow valves, 1122 to 1126 are valves for gas bombs, 1127 to 1131 are outlet pressure gauges, 1132 is an auxiliary valve, 1133 is a lever, 1134 is a main valve, 1135 is a leak valve, 1136 is a vacuum gauge, 1137 is a substrate material of the resistor to be prepared, 1138 is a heater, 1139 is a substrate supporting member, 1140 is a high voltage power source, 1141 is an electrode, and 1142 is a shutter. 1142-1 is a target which is mounted on the electrode 1141 in carrying out the sputtering method.

In the case of forming a-C:(X,H), for example, 1102 is hermetically filled with $CF_4$ gas (purity: 99.9% or higher) diluted with Ar gas, 1103 hermetically filled with $C_2F_6$ gas (purity: 99.9% or higher) diluted with Ar gas, 1104 hermetically filled with $H_2$ gas (purity: 99.9% or higher), and 1105 hermetically filled with $CHF_3$ gas (purity: 99.9% or higher) diluted with Ar gas. Prior to inflow of the gases in these bombs, while confirming that the valves 1122 to 1126 for the respective bombs 1102 to 1106 and the leak valve 1135 are closed, and also confirming that the inflow valves 1112 to 1116, the outflow valves 1117 to 1121 and the auxiliary valve 1132 are opened, first the main valve 1134 is opened to evacuate internally the deposition chamber and the gas pipelines. Next, when the reading on the vacuum gauge becomes about $1.5 \times 10^{-6}$ Torr, the auxiliary valve 1132, the inflow valves 1112 to 1116 and the outflow valves 1117 to 1121 are closed. Then, the valves of the gas pipelines connected to the bomb of the gas to be introduced into the deposition chamber 1101 is opened to introduce the desired gas into the deposition chamber 1101.

Next, an example of the procedure when preparing the resistor of the present invention according to the glow discharge method by use of the above device is described. By opening the valve 1122, $CF_4$/Ar gas is permitted to flow out from the gas bomb 1102, while $H_2$ gas to flow out from the gas bomb 1104 by opening the valve 1124, and then with adjustment of the outlet pressure gauges, 1127, 1129 to 1 $kg/cm^2$, to flow into the mass flow controllers 1107, 1109 by opening gradually the inflow valves 1112, 1114. Subsequently, by opening gradually the inflow valves 1117, 1119 and the auxiliary valve 1132, $CF_4$/Ar gas and $H_2$ gas are introduced into the deposition chamber 1101. During this operation, the mass flow controllers 1107, 1109 are adjusted so that the ratio of the flow rate of $CF_4$/Ar gas to the flow rate of $H_2$ gas may become a desired value, and also the opening of the main valve 1134 is adjusted while watching the reading on the vacuum gauge 1136 so that the pressure in the deposition chamber 1101 may become a desired value. And, after the substrate 1137 supported by the supporting member 1139 in the deposition chamber 1101 is heated by the heater 1138 to a desired temperature, the shutter 1142 is opened and glow discharging is excited in the deposition chamber 1101.

When the contents of halogen atoms and/or hydrogen atoms are distributed nonuniformly in the layer thickness direction in the case of forming a-C:(X,H) by use of the glow discharge method, the operations of changing the openings of the inflow valves 1117, 1119 may be performed manually or by means of an externally driven motor, etc. to change the flow rate of $CF_4$/Ar gas and/or the flow rtte of $H_2$ gas with lapse of time following the change rate curve previously designed, thereby changing the contents of F atoms and/or H atoms in the heat-generating resistor in the film thickness direction.

Next, an example of the procedure when preparing the resistor of the present invention according to the sputtering method by use of the above device is described. On the electrode 1141 on which high voltage is to be applied from the high voltage power source 1140, a high purity graphite 1142-1 is previously disposed as the target. Similarly as in the case of the glow discharge method, $CHF_3$/Ar gas is introduced from the gas bomb 1105 into the deposition chamber 1101 at a desired flow rate. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method.

In the case of forming a-C:(H,X) according to the sputtering method, for distributing nonuniformly halogen atoms and/or hydrogen atoms in the layer thickness direction, the same method as in the glow discharge method may be employed. That is, similarly as in the case of the glow discharge method, the operation of changing the openings of the outflow valve 1120 may be performed to change the flow rate of $CHF_3$/Ar gas with lapse of time following the change rate curve previously designed, thereby changing the contents of F atoms and/or H atoms in the heat-generating resistor in the film thickness direction.

When forming a thin film 4 comprising a-C:Si:(X,H), for example, using $CF_4$ gas (purity: 99.9% or higher) diluted with Ar gas, $SiH_4$ gas (purity: 99.9% or higher) diluted with Ar gas, $C_2F_6$ gas (purity: 99.9% or higher) diluted with Ar gas and $Si_2H_6$ (purity: 99.9% or higher) diluted with Ar gas respectively as the gases filled hermetically in the above bombs 1102 to 1105, the film can be formed according to the procedure in the case of the glow discharge method as described below.

By opening the valve 1122, $CF_4$/Ar gas is permitted to flow out from the gas bomb 1102, while $SiH_4$/Ar gas to flow out from the gas bomb 1103 by opening the valve 1123, and then with adjustment of the outlet pressure gauges, 1127, 1128 to 1 $kg/cm^2$, to flow into the mass flow controllers 1107, 1108 by opening gradually the inflow valves 1112, 1113. Subsequently, by opening gradually the inflow valves 1117, 1118 and the auxiliary valve 1132, $CF_4$/Ar gas and $SiH_4$/Ar gas are introduced into the deposition chamber 1101. During this operation, the mass flow controllers 1107, 1108 are adjusted so that the ratio of the flow rate of $CF_4$/Ar gas to the flow rate of $SiH_4$/Ar gas may become a desired value, and also the opening of the main valve 1134 is adjusted while watching the reading on the vacuum gauge 1136 so that the pressure in the deposition chamber may become a desired value. And, after the substrate 1137 supported by the supporting member 1139 in the deposition chamber is heated by the heater 1138 to a desired temperature, the shutter 1142 is opened and glow discharging is excited in the deposition chamber 1101.

Next, an example of the procedure when preparing the resistor of the present invention according to the sputtering method by use of the above device is described. On the electrode 1141 on which high voltage is to be applied from the high voltage power source 1140, a high purity graphite 1142-1 is previously disposed as the target. Similarly as in the case of the glow discharge method, $CF_4$/Ar gas from the gas bomb 1102 and $SiH_4$/Ar gas from the gas bomb 1103 are introduced into the deposition chamber 1101 at a desired flow rate. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method.

When forming a thin film 4 comprising a-C:Ge:(X,H), it can be formed according to the glow discharge method or the sputtering method by, for example, using $CF_4$ gas (purity: 99.9% or higher) diluted with Ar gas, $GeH_4$ gas (purity: 99.9% or higher) diluted with Ar gas and $C_2F_6$ gas (purity: 99.9% or higher) diluted with Ar gas respectively as the gases filled hermetically in the above bombs 1102 to 1104.

The film forming procedure in this case is not different basically from those for formation of a-C:(X,H) an a-C:Si(X,H) as described above, and an example is briefly described below.

When forming a-C:Ge:(X,H) according to the glow discharge method, by opening the valve 1122, $CF_4$/Ar gas is permitted to flow out from the gas bomb 1102, while $GeH_4$/Ar gas to flow out from the gas bomb 1103 by opening the valve 1123, and then with adjustment of the outlet pressure gauges 1127, 1128 to 1 $kg/cm^2$, to flow into the mass flow controllers 1107, 1108 by opening gradually the inflow valves 1112, 1113. Subsequently, by opening gradually the inflow valves 1117, 1118 and the auxiliary valve 1132, $CF_4$/Ar gas and $GeH_4$/Ar gas are introduced into the deposition chamber 1101. During this operation, the mass flow controllers 1107, 1108 are adjusted so that the ratio of the flow rate of $CF_4$/Ar gas to the flow rate of $GeH_4$/Ar gas may become a desired value, and also the opening of the main valve 1134 is adjusted while watching the reading on the vacuum gauge 1136 so that the pressure in the deposition chamber may become a desired value. And, after the substrate 1137 supported by the supporting member 1139 in the deposition chamber is heated by the heater 1138 to a desired temperature, the shutter 1142 is opened and glow discharging is excited in the deposition chamber 1101.

Also, an example of the procedure when forming a-C:Ge:(X,H) according to the sputtering method is described below. On the electrode 1141 on which high voltage is to be applied from the high voltage power source 1140, a high purity graphite 1142-1 is previously disposed as the target. Similarly as in the case of the glow discharge method, CF$_4$/Ar gas is introduced from the gas bomb 1102 and GeH$_4$/Ar gas from the gas bomb 1103 into the deposition chamber 1101 at respective desired flow rates. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method.

When forming a thin film 4 comprising a-C:Si:Ge:(X,H), the above gas bombs 1102 to 1106 are hermetically filled with the gases of, for example, CH$_4$ gas (purity: 99.9% or higher) diluted with Ar gas, SiH$_4$ gas (purity: 99.9% or higher) diluted with Ar gas, GeF$_4$ gas (purity: 99.9% or higher) diluted with Ar gas, and SiF$_4$ gas (purity: 99.9% or higher) diluted with Ar gas respectively in this order.

And when forming a-C:Si:Ge:(X,H) according to the glow discharge method, by opening the valve 1122, CH$_4$/Ar gas is permitted to flow out from the gas bomb 1102, while SiH$_4$/Ar gas to flow out from the gas bomb 1103 by opening the valve 1123 and GeF$_4$/Ar gas to flow out from the gas bomb 1104 by opening the valve 1124, and then with adjustment of the outlet pressure gauges 1127, 1128 and 1129 to 1 kg/cm$^2$, to flow into the mass flow controllers 1107, 1108 and 1109 by opening gradually the inflow valves 1112, 1113 and 1114. Subsequently, by opening gradually the inflow valves 1117, 1118 and 1119, and the auxiliary valve 1132, CH$_4$/Ar gas, SiH$_4$/Ar gas and GeF$_4$/Ar gas are introduced into the deposition chamber 1101. During this operation, the mass flow controllers 1107, 1108 and 1109 are adjusted so that the ratio of the flow rate of CH$_4$/Ar gas, the flow rate of SiH$_4$/Ar gas and GeF$_4$/Ar gas may become a desired value, and also the opening of the main valve 1134 is adjusted while watching the reading on the vacuum gauge 1136 so that the pressure in the deposition chamber may become a desired value. And, after the substrate 1137 supported by the supporting member 1139 in the deposition chamber is heated by the heater 1138 to a desired temperature, the shutter 1142 is opened and glow discharging is excited in the deposition chamber 1101.

When forming a-C:Si:Ge:(X,H) according to the sputtering method, on the electrode 1141 on which high voltage is to be applied from the high voltage power source 1140, a high purity graphite 1142-1 is previously disposed as the target. Similarly as in the case of the glow discharge method, SiH$_4$/Ar gas is introduced from the gas bomb 1103 and GeF$_4$/Ar gas from the gas bomb 1104 into the deposition chamber 1101 at respective desired flow rates. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a pressure by controlling the opening of the valve 1134 are the same as in the case of the glow discharge method.

In a-C:Si:(X,H), a-C:Ge:(X,H) and a-C:Si:Ge:(X,H) as described above, when the distribution of the atoms selected from Si, Ge, X and H in the layer thickness direction is made nonuniformly, it can be accomplished by, for example, changing the amounts of the respective starting gases employed so as to obtain a desired distribution, which is basically the same as in the case of changing the distribution of X and/or H in a-C:(X,H).

In the present invention, for further improvement of resistance value controllability, a substance for controlling electroconductivity may also be contained.

For the substance for controlling electroconductivity, there may be utilized the so called impurities in the field of semiconductors, namely p-type impurities giving p-type conduction characteristics to carbon and n-type impurities giving n-type conduction characteristics to carbon. As the p-type impurities, the atoms belonging to the group III of the periodic table such as B, Al, Ga, In and Tl may be included, particularly preferably B and Ga. As the n-type impurities, the atoms belonging to the group V of the periodic table such as P, As, Sb and Bi may be included, particularly P and As. These can be used either singularly or in combination.

In this case, the content of the substance for controlling electroconductivity in the functional thin film 4 may be selected suitably so as to obtain desirable characteristics depending on the purpose of use of the resistor, but it may preferably be 0.01 to 50000 atomic ppm, more preferably 0.5 to 10000 atomic ppm, optimally 1 to 5000 atomic ppm.

The content of hydrogen atoms, halogen atoms, silicon atoms and germanium atoms in this case may be also within the same ranges as specified above.

Also in the case of the functional thin film 4 comprising an amorphous material containing halogen atoms, hydrogen atoms and a substance for controlling electroconductivity in a matrix of carbon atoms (hereinafter sometimes abbreviated as "a-C:(X,H)(p,n)"; here, (p,n) represents a substance for controlling electroconductivity) in the heat-generating resistor of the present invention, it can be formed according to a plasma CVD method such as the glow discharge method or a vacuum deposition method such as the sputtering method. More specifically, during formation of a-C:(H,X) as described above, a starting gas for supplying a substance for controlling electroconductivity may be further introduced. Also, by introducing a starting gas for supplying a substance for controlling electroconductivity during formation of A-C:Si:(X,H), a-C:Ge:(X,H) or a-C:Si:Ge(X,H), it is possible to form an a-C:Si:(X,H)(p,n), a-C:Ge:(X,H)(p,n) or a-C:Si:Ge(X,H)(p,n) layer containing the substance for controlling electroconductivity, respectively.

For example, for formation of the thin film 4 comprising a-C:(X,H)(p,n) according to the glow discharge method, the basic process may comprise arranging the substrate 2 in a deposition chamber under reduced pressure, introducing a starting gas for C supply capable of supplying carbon atoms (C), a starting gas for X supply capable of supplying halogen atoms (X), a starting gas for H supply capable of supplying hydrogen atoms (H) and a starting gas for supply of a substance for controlling electroconductivity into the deposition chamber, and exciting glow discharging by use of high frequency or microwave in the deposition chamber thereby to form a layer comprising a-C:(X,H)(p,n) on the surface of the substrate 2.

On the other hand, for formation of the thin film 4 comprising a-C:(X,H)(p,n) according to the sputtering method, the basic process may comprise arranging the substrate 2 in a deposition chamber under reduced pressure and introducing a starting gas for X supply, a starting gas for H supply and a starting gas for supplying a substance for controlling electroconductivity into the deposition chamber in carrying out sputtering of a target constituted of C in an atmosphere of an inert gas such as Ar, He or the like or a gas mixture based on these gases in the deposition chamber.

The starting material for supplying a substance for controlling electroconductivity may include the exemplary compounds as shown below.

Examples of the starting material for supplying the group III atoms are boron hydrides such as $B_2H_6$, $B_4H_{10}$, $B_5H_9$, $B_5H_{11}$, $B_6H_{10}$, $B_6H_{12}$, $B_6H_{14}$ or the like and boron halides such as $BF_3$, $BCl_3$, $BBr_3$ or the like for supplying boron atoms, and further $AlCl_3$, $GaCl_3$, $Ga(CH_3)_3$, $InCl_3$, $TlCl_3$ and others for supplying other atoms.

Examples of he starting material for supplying the group V atoms are phosphorus hydrides such as $PH_3$, $P_2H_4$ or the like and phosphorus halides such as $PH_4I$, $PF_3$, $PF_5$, $PCl_3$, $PCl_5$, $PBr_3$, $PBr_5$, $PI_3$ or the like for supplying phosphorus, and further $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and others for supplying other atoms.

These starting materials may be used either alone or in combination.

In the present invention, not only the atoms selected from silicon atoms, germanium atoms, halogen atoms and hydrogen atoms may be nonuniform in the functional thin film 4 in the film thickness direction, but also the distribution of the substance for controlling electroconductivity may be nonuniform in the film thickness direction, or only the substance for controlling electroconductivity may be distributed nonuniformly in the thickness direction. The content of the substance selected from halogen atoms, hydrogen atoms, silicon atoms, germanium atoms and the substance for controlling electroconductivity in the functional thin film 4 may be changed in a manner such that it is gradually increased from the substrate 2 side toward the surface side or, on the contrary, the content is reduced. Further, the content of the substance selected from halogen atoms, hydrogen atoms, silicon atoms, germanium atoms and the substance for controlling electroconductivity in the functional thin film 4 may be changed in a manner such that it may have maximum or minimum value. The change in content of the substance selected from halogen atoms, hydrogen atoms, silicon atoms, germanium atoms and the substance for controlling electroconductivity in the functional thin film 4 in the film thickness direction may be selected optimally so that desired characteristics may be obtained depending on the use of the heat-generating resistor.

FIGS. 5 through 10 show examples of the changes in contents of the substance selected from halogen atoms, hydrogen atoms, silicon atoms, germanium atoms and the substance for controlling electroconductivity in the functional thin film 4 with respect to the film thickness direction. In these Figures, the ordinate represents the distance T from the interface with the substrate 2 in the film thickness direction, and t represents the film thickness of the functional thin film 4. On the other hand, the abscissa represents the content C of the substance selected from halogen atoms, hydrogen atoms, silicon atoms, germanium atoms and the substance for controlling electroconductivity. In respective Figures, the scales on the ordinate T and the abscissa C are not necessarily uniform, but they are changed so as to exhibit the characteristics of the respective Figures. Accordingly, in practical application, various distributions based on the difference in specific numerical values are used for respective Figures.

Of course, when two or more kinds of the above substances are contained, it is not necessarily required that those substances should exhibit the same distribution curves, but each of them can be determined so that desired characteristics may be obtained.

By referring to an example of an amorphous material comprising a-C:(X,H)(p,n) containing halogen atoms, hydrogen atoms and a substance for controlling conductivity in a matrix of carbon atoms, the method for forming a thin film containing halogen atoms, hydrogen atoms, and the substance for controlling electroconductivity distributed nonuniformly is described briefly below.

For formation of a thin film 4 comprising a-C:(X,H)(p,n) according to the glow discharge method, the basic process may comprise arranging the substrate 2 in a deposition chamber under reduced pressure, introducing a starting gas for C supply capable of supplying carbon atoms (C), a starting gas for X supply capable of supplying halogen atoms (X), a starting gas for H supply capable of supplying hydrogen atoms (H) and a starting gas for supply of a substance for controlling electroconductivity into the deposition chamber, while changing the amounts of the starting gas selected from the starting gas for X supply, the starting gas for H supply and the starting gas for supply of the substance for controlling electroconductivity, and exciting glow discharging by use of high frequency or microwave in the deposition chamber thereby to form a layer comprising a-C:(X,H)(p,n) on the surface of the substrate 2.

On the other hand, for formation of the thin film 4 comprising a-C:(X,H)(p,n) according to the sputtering method, the basic process may comprise arranging the substrate 2 in a deposition chamber under reduced pressure and introducing a starting gas for X supply, a starting gas for H supply and a starting gas for supplying a substance for controlling electroconductivity into the deposition chamber, while varying their amounts introduced, in carrying out sputtering of a target constituted of C in an atmosphere of an inert gas such as Ar, He or the like or a gas mixture based on these gases in said deposition chamber.

More specifically, to explain by referring to the device as shown in FIG. 3, for example, 1102 is hermetically filled with $CF_4$ gas (purity 99.9% or higher) diluted with Ar gas, the bomb 1103 hermetically filled with $PH_3$ gas (purity: 99.9% or higher) diluted with Ar gas and 1104 hermetically filled with $B_2H_6$ gas (purity: 99.9% or higher) diluted with Ar gas. Prior to inflow of the gases in these bombs into the deposition chamber 1101, while confirming that the valves 1122 to 1126 for the respective bombs 1102 to 1106 and the leak valve 1135 are closed, and also confirming that the inflow valves 1112 to 1116, the outflow valves 1117 to 1121 and the auxiliary valve 1132 are opened, first the main valve 1134 is opened to evacuate internally the deposition chamber 1101 and the gas pipelines. Next, when the reading on the vacuum gauge becomes about $1.5 \times 10^{-6}$ Torr, the auxiliary valve 1132, the inflow valves 1112 to 1116 and the outflow valves 1117 to 1121 are closed. Then, the valves of the gas pipelines connected to the bomb of the gas to be introduced into the deposition chamber 1101 is opened to introduce the desired gas into the deposition chamber 1101.

Next, an example of the procedure when preparing the resistor of the present invention according to the glow discharge method by use of the above device is described. By opening the valve 1122, $CF_4/Ar$ gas is permitted to flow out from the gas bomb 1102 and $PH_3/Ar$ gas to flow out from the gas bomb 1103 by opening the valve 1123, and then with adjustment of the outlet pressure gauges 1127 and 1128 to 1 kg/cm$^2$, to flow into the mass flow controllers 1107 and 1108 by opening gradually the inflow valves 1112 and 1113. Subsequently, by opening gradually the inflow valves 1117, 1118 and the auxiliary valve 1132, $CF_4/Ar$ gas and $PH_3/Ar$ gas are introduced into the deposition chamber 1101. During this operation, the mass flow controllers 1107, 1108 are adjusted so that the ratio of the flow rate of $CF_4/Ar$ gas to the flow rate of $PH_3/Ar$ gas may become a desired value, and also the opening of the main valve 1134 is adjusted while watching the reading on the vacuum gauge 1136 so that the pressure in the deposition chamber may become a desired value. And, after the substrate 1137 supported by the supporting member 1139 in the deposition chamber is heated by the heater 1138 to a desired temperature, the shutter 1142 is opened and glow discharging is excited in the deposition chamber 1101. And the operations of changing the openings of the inflow valves 1117, 1118 may be performed manually or by means of an externally driven motor, etc. to change the flow rate of $CF_4/Ar$ gas and/or the flow rate of $PH_3/Ar$ gas with lapse of time following the change rate curve previously designed, thereby changing the content of F atoms, H atoms or the substance for controlling electroconductivity in the functional thin film 4 in the film thickness direction.

Next, an example of the procedure when preparing the resistor of the present invention according to the sputtering method by use of the above device is described. On the electrode 1141 on which high voltage is to be applied from the high voltage power source 1140, a high purity graphite 1142-1 is previously disposed as the target. Similarly as in the case of the glow discharge method, $CF_4/Ar$ gas is introduced from the gas bomb 1102 and $PH_3/Ar$ gas from the gas bomb 1103 into the deposition chamber 1101 at the respective desired flow rates. By actuating the high voltage power source 1140 with opening of the shutter 1142, the target 1142-1 is subjected to sputtering. The operations of heating the substrate 1137 to a desired temperature by the heater 1138 and adjusting internally the deposition chamber 1101 to a desired pressure by controlling the opening of the main valve 1134 are the same as in the case of the glow discharge method. And the operations of changing the openings of the outflow valves 1117, 1118 may be performed similarly as in the case of the above glow discharge method to change the flow rate of $CF_4/Ar$ gas and/or the flow rate of $PH_3/Ar$ gas with lapse of time following the change rate curve previously designed, thereby changing the content of F atoms, H atoms and/or the substance for controlling electroconductivity in the functional thin film 4 in the film thickness direction.

According to the present invention as described above, by use of an amorphous material containing halogen atoms and hydrogen atoms in a matrix of carbon atoms as the functional thin film, there are provided a heat-generating resistor and a heat-generating resistance element which are markedly good in characteristics such as heat response, thermal conductivity, heat resistance and durability. Also, the functional thin film of the present invention can be formed with ease.

Further, by making the halogen atoms and/or hydrogen atoms nonuniformly distributed in the film thickness direction, various characteristics such as heat accumulability, heat dissipatability, adhesiveness of the substrate to the functional thin film, etc. can be realized with ease.

Also, by use of an amorphous material containing halogen atoms, hydrogen atoms and a substance for controlling electroconductivity in a matrix of carbon atoms as the functional thin film, there are provided a heat-generating resistor and a heat-generating resistance element which are further markedly good in controllability of resistance value.

Further, by making the content of the substance selected from halogen atoms, hydrogen atoms and a substance for controlling electroconductivity distributed nonuniformly in the film thickness direction in the functional thin film, various characteristics such as heat accumulability, heat dissipatability, adhesiveness of the substrate to the functional thin film, etc. can be realized with ease.

In addition, according to the present invention, by use of an amorphous material containing silicon atoms, halogen atoms, and hydrogen atoms in a matrix of carbon atoms as the functional thin film, there is provided a heat-generating resistor and a heat-generating resistance element which are further markedly good in mechanical strength.

Further, according to the present invention, by making the content of the substance selected from silicon atoms, halogen atoms and hydrogen atoms distributed nonuniformly in the film thickness direction in the functional thin film, various characteristics such as heat accumulability, heat dissipatability, adhesiveness of the substrate to the functional thin film, etc. can be realized with ease.

Furthermore, by use of an amorphous material containing germanium atoms, halogen atoms and hydrogen atoms in a matrix of carbon atoms as the functional thin film, there are provided a heat-generating resistor and a heat-generating resistance element which are also markedly good in flexibility.

Also, according to the present invention, by making the content of the substance selected from germanium atoms, halogen atoms and hydrogen atoms distributed nonuniformly in the film thickness direction in the functional thin film, various characteristics such as heat accumulability, heat dissipatability, adhesiveness of the substrate to the functional thin film, etc. can be realized with ease.

In addition, by use of an amorphous material containing silicon atoms, germanium atoms, halogen atoms and hydrogen atoms in a matrix of carbon atoms as the functional thin film, there are provided a heat-generating resistor and a heat-generating resistance element which are also markedly good in chemical resistance and flexibility.

Further, by making the content of the substance selected from silicon atoms, germanium atoms, halogen atoms and hydrogen atoms distributed nonuniformly in the film thickness direction in the functional thin film, various characteristics such as heat accumulability, heat dissipatability, adhesiveness of the substrate to the functional thin film, etc. can be realized with ease.

In the following, specific examples of the heat-generating resistor of the present invention are shown.

EXAMPLE 1

By use of an alumina ceramic plate as a substrate, a heat-generating resistance layer which is a functional thin film was formed on the surface of the substrate. Deposition of the heat-generating resistance layer was carried out according to the glow discharge method by use of a device shown in FIG. 3. As the starting gas, $CF_4/Ar = 0.5$ (volume ratio) and $H_2$ were employed. The conditions during deposition are as shown in Table 1. During deposition, the degrees of opening of the respective valves and other conditions were maintained constant, and the heat-generating resistance layer with a thickness shown in Table 1 was formed.

After an aluminum layer was formed on the thus obtained resistance layer formed according to the electron beam vapor deposition method, said aluminum layer was etched to a desired shape by photolithographic technique to form plural pairs of electrodes.

Subsequently, the resistance layer at a predetermined portion was removed by use of a HF type etchant according to photolithographic technique. In this Example, the size of the resistance layer lying between the above electrode pair was made 100 $\mu$m × 100 $\mu$m. In this Example, a plural number of heatgenerating resistance elements were prepared on the substrate so that the heat-generating elements formed between the electrode pairs may be arranged at a pitch of 8 elements/mm. FIG. 4 shows a partial sectional view of the thus prepared heat-generating resistance element. In the FIG., 2 is a substrate, 4 is a heat-generating resistance layer, and 6, 7 are a pair of electrodes.

Electric resistance of each heat-generating element thus obtained was measured to be 80 ohm.

Also, durability of the heat-generating resistance elements was measured by inputting electrical pulse signals into the heat-generating resistance element obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 2

A heat-generating resistance layer with the same thickness was deposited in the same manner as in Example 1 except for changing the starting gases to $C_2F_6/Ar = 0.2$ (volume ratio) and $H_2$, and the discharging power to 1.5 W/cm$^2$.

Next, when heat-generating resistance element were prepared and electrical pulse signal was inputted therein in the same manner as in Example 1, the heat-generating resistance element were not destroyed even when the number of electrical pulse signal inputting reached $1 \times 10^{10}$ times. Also, no change in resistance values were recognized.

EXAMPLE 3

Heat-generating resistance elements were prepared by depositing a heat-generating resistance layer in the same manner as in Example 1 except for changing the substrate to #7059 glass produced by Corning Glass Works.

When the thus obtained heat-generating resistance elements were driven in the same manner as in Example 1, it was confirmed that they had satisfactory durability similarly as in Example 1.

EXAMPLE 4

Heat-generating resistance elements were prepared by depositing a heat-generating resistance layer in the same manner as in Example 2 except for changing the substrate to #7059 glass.

When the thus obtained heat-generating resistance element were driven in the same manner as in Example 2, it was confirmed that they had satisfactory durability similarly as in Example 2.

EXAMPLE 5

By use of an alumina ceramic plate as a substrate, a heat-generating resistance layer which is a functional thin film was formed on the surface of the substrate. Deposition of the heat-generating resistance layer was carried out according to the sputtering method by use of a device shown in FIG. 3. As the target for sputtering, a graphite having a purity of 99.9% or higher was employed, and as the starting gas, $CHF_3/Ar = 0.1$ (volume ratio) was employed. The conditions during deposition are as shown in Table 1. The gas pressure in the deposition chamber during sputtering was $4 \times 10^{-2}$ Torr. During deposition, the degrees of opening of the respective valves and other conditions were maintained constant, and the heat-generating resistance layer with a thickness shown in Table 1 was formed.

By use of the thus prepared resistance layer, heat-generating resistance elements were prepared and further electrical pulse signal was inputted therein in the same manner as in Example 1. They were confirmed to be excellent in durability similarly as in Example 1.

TABLE 1

| Example No. | Starting material | Gas flow rate (SCCM) | Discharging power (W/cm$^2$) | Substrate temperature (°C.) | Film thickness (Å) |
|---|---|---|---|---|---|
| 1 | $CF_4/Ar =$ 0.5 | 50 | 0.8 | 350 | 3000 |
|   | $H_2$ | 1 | | | |
| 2 | $C_2F_6/Ar =$ 0.2 | 50 | 1.5 | 350 | 3000 |
|   | $H_2$ | 1 | | | |
| 3 | $CF_4/Ar =$ 0.5 | 50 | 0.8 | 350 | 3000 |
|   | $H_2$ | 1 | | | |
| 4 | $C_2F_6/Ar =$ 0.2 | 50 | 1.5 | 350 | 3000 |
|   | $H_2$ | 1 | | | |
| 5 | $CHF_3/Ar =$ 0.1 | 20 | 5 | 350 | 3000 |

EXAMPLE 6

A heat-generating resistance layer was prepared in the same manner as Example 1 except for changing the flow rate of $H_2$ gas by changing continuously the degree of opening of the valve during deposition and heat-generating resistance elements were prepared in the same manner by use of the resistance layer. The conditions during deposition were as shown in Table 2.

Electric resistance of each heat-generating element thus obtained was measured to be 85 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 7

A heat-generating resistance layer with the same thickness was deposited in the same manner as in Example 6 except for changing the starting gases to $C_2F_6/Ar=0.5$ (volume ratio) and $H_2$ and the discharging power to 1.5 W/cm².

Next, when heat-generating resistance elements were prepared and electrical pulse signal was inputted therein in the same manner as in Example 6, the heat-generating resistance elements were not destroyed even when the number of electrical pulse signal inputting reached $1 \times 10^{10}$ times. Also, no change in resistance values were recognized.

EXAMPLE 8

Heat-generating resistance elements were prepared by depositing a heat-generating resistance layer in the same manner as in Example 6 except for changing the substrate to #7059 glass and varying the gas flow rate of $H_2$ gas.

When the thus obtained heat-generating resistance elements were driven in the same manner as in Example 6, it was confirmed that they had satisfactory durability similarly as in Example 6.

EXAMPLE 9

Heat-generating resistance elements were prepared by depositing a heat-generating resistance layer in the same manner as in Example 7 except for changing the substrate to #7059 glass and varying the gas flow rate of $H_2$ gas.

When the thus obtained heat-generating resistance element were driven in the same manner as in Example 7, it was confirmed that they had satisfactory durability similarly as in Example 7.

EXAMPLE 10

A heat-generating resistance layer with a thickness as shown in Table 2 was prepared in the same manner as in Example 5 except for changing the flow rate of $CHF_3/Ar$ gas by changing continuously the degree of opening of the valve during deposition. The conditions during deposition were as shown in Table 2.

By use of the thus prepared resistance layer, heat-generating resistance elements were prepared and further electrical pulse signal was inputted therein in the same manner as in Example 6, and they were confirmed to be excellent in durability similarly as in Example 6.

TABLE 2

| Example No. | Starting material | Gas flow rate (SCCM) | Discharging power (W/cm²) | Substrate temperature (°C.) | Film thickness (Å) |
|---|---|---|---|---|---|
| 6 | $CF_4/Ar = 0.5$ | 50 | 0.8 | 350 | 3000 |
|   | $H_2$ | 2 → 1 | | | |
| 7 | $C_2F_6/Ar = 0.5$ | 50 | 1.5 | 350 | 3000 |
|   | $H_2$ | 2 → 1 | | | |
| 8 | $CF_4/Ar = 0.5$ | 50 | 0.8 | 350 | 3000 |
|   | $H_2$ | 1 → 2 | | | |
| 9 | $C_2F_6/Ar = 0.5$ | 50 | 1.5 | 350 | 3000 |
|   | $H_2$ | 1 → 2 | | | |
| 10 | $CHF_3/Ar = 0.1$ | 20 → 10 | 5 | 350 | 3000 |

EXAMPLE 11

Heat-generating resistance layer and heat-generating resistance elements were prepared in the same manner as in Example 1 except for changing $H_2$ of the starting gases in Example 1 to $PH_3/Ar=1000$ ppm (volume ratio) and changing the conditions during deposition as shown in Table 3.

Electric resistance of each heat-generating element thus obtained was measured to be 75 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 12

A heat-generating resistance layer with the same thickness was deposited in the same manner as in Example 11 except for changing the starting gases to $CF_4/Ar=0.5$ (volume ratio) and $B_2H_6/Ar=1000$ ppm (volume ratio).

Next, when heat-generating resistance elements were prepared and electrical pulse signal was inputted therein in the same manner as in Example 11, the heat-generating resistance elements were not destroyed even when the number of electrical pulse signal inputting reached $1 \times 10^{10}$ times. Also, no change in resistance value was recognized.

EXAMPLE 13

Heat-generating resistance elements were prepared by depositing a heat-generating resistance layer in the same manner as in Example 11 except for changing the substrate to #7059 glass.

When the thus obtained heat-generating resistance elements were driven in the same manner as in Example 11, it was confirmed that they had satisfactory durability similarly as in Example 11.

EXAMPLE 14

Heat-generating resistance elements were prepared by depositing a heat-generating resistance layer in the same manner as in Example 12 except for changing the substrate to #7059 glass.

When the thus obtained heat-generating resistance elements were driven in the same manner as in Example 12, it was confirmed that they had satisfactory durability similarly as Example 12.

TABLE 3

| Example No. | Starting material | Gas flow rate (SCCM) | Discharging power (W/cm$^2$) | Substrate temperature (°C.) | Film thickness (Å) |
|---|---|---|---|---|---|
| 11 | CF$_4$/Ar = 0.5 | 50 | 1.5 | 350 | 3000 |
|  | PH$_3$/Ar = 1000 ppm | 125 |  |  |  |
| 12 | CF$_4$/Ar = 0.5 | 50 | 1.5 | 350 | 3000 |
|  | B$_2$H$_6$/Ar = 1000 ppm | 125 |  |  |  |
| 13 | CF$_4$/Ar = 0.5 | 50 | 1.5 | 350 | 3000 |
|  | PH$_3$/Ar = 1000 ppm | 125 |  |  |  |
| 14 | CF$_4$/Ar = 0.5 | 50 | 1.5 | 350 | 3000 |
|  | B$_2$H$_6$/Ar = 1000 ppm | 125 |  |  |  |

EXAMPLE 15

A heat-generating resistance layer with a thickness as shown in Table 4 was prepared in the same manner as in Example 11 except for changing the flow rate of CF$_4$/Ar gas by changing continuously the degree of opening of the valve during formation of the heat-generating resistance layer. Also, heat-generating resistance elements were prepared by use of this heat-generating resistance layer.

Electric resistance of each heat-generating element thus obtained was measured to be 80 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 16

A heat-generating resistance layer with the same thickness was deposited in the same manner as Example 15 except for changing the starting gases to CF$_4$/Ar=0.5 (volume ratio) and B=1000 ppm (volume ratio).

Next, when heat-generating resistance elements were prepared and electrical pulse signal was inputted therein in the same manner as in Example 11, the heat-generating resistance device was not destroyed even when the number of electrical pulse signal inputting reached $1 \times 10^{10}$ times. Also, no change in resistance value was recognized.

EXAMPLE 17

Heat-generating resistance elements were prepared by depositing a heat-generating resistance layer in the same manner as in Example 15 except for maintaining the CF$_4$/Ar gas flow rate constant and changing continuously the discharging power.

When the thus obtained heat-generating resistance elements were driven in the same manner as in Example 15, it was confirmed that they had satisfactory durability similarly as in Example 15.

EXAMPLE 18

Heat-generating resistance elements were prepared by depositing a heat-generating resistance layer in the same manner as in Example 16 except for maintaining the CF$_4$/Ar gas flow rate constant and changing continuously the discharging power.

When the thus obtained heat-generating resistance elements were driven in the same manner as in Example 16, it was confirmed that they had satisfactory durability similarly as in Example 16.

TABLE 4

| Example No. | Starting material | Gas flow rate (SCCM) | Discharging power (W/cm$^2$) | Substrate temperature (°C.) | Film thickness (Å) |
|---|---|---|---|---|---|
| 15 | CF$_4$/Ar = 0.5 | 50 → 30 | 1.5 | 350 | 3000 |
|  | PH$_3$/Ar = 1000 ppm | 125 |  |  |  |
| 16 | CF$_4$/Ar = 0.5 | 50 → 30 | 1.5 | 350 | 3000 |
|  | B$_2$H$_6$/Ar = 1000 ppm | 125 |  |  |  |
| 17 | CF$_4$/Ar = 0.5 | 50 | 1.5 → 1.6 | 350 | 3000 |
|  | PH$_3$/Ar = 1000 ppm | 125 |  |  |  |
| 18 | CF$_4$/Ar = 0.5 | 50 | 1.5 → 1.6 | 350 | 3000° |
|  | B$_2$H$_6$/Ar = 1000 ppm | 125 |  |  |  |

EXAMPLE 19

A heat-generating resistance layer and heat-generating resistance elements were prepared in the same manner as Example 1 except for changing H$_2$ of the starting gases in Example 1 to SiH$_4$/Ar=0.1 (volume ratio) and changing the conditions during deposition as shown in Table 5.

Electric resistance of each heat-generating element thus obtained was measured to be 80 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 20

A heat-generating resistance layer with the same thickness was deposited in the same manner as Example 19 except for changing the starting gases to C$_2$F$_6$/Ar=0.5 (volume ratio) and Si$_2$H$_6$/Ar=0.1 (volume ratio).

Next, when heat-generating resistance elements were prepared and electrical pulse signal was inputted therein in the same manner as in Example 19, the heat-generating resistance elements were not destroyed even when the number of electrical pulse signal inputting reached $1 \times 10^{10}$ times. Also, no change in resistance value was recognized.

EXAMPLE 21

Heat-generating resistance elements were prepared by depositing a heat-generating resistance layer in the same manner as in Example 19 except for changing the substrate to #7059 glass.

When the thus obtained heat-generating resistance elements were driven in the same manner as in Example 19, it was confirmed that they had satisfactory durability similarly as in Example 19.

EXAMPLE 22

Heat-generating resistance elements were prepared by depositing a heat-generating resistance layer in the same manner as in Example 20 except for changing the substrate to #7059 glass.

When the thus obtained heat-generating resistance elements were driven in the same manner as in Example 20, it was confirmed that they had satisfactory durability similarly as in Example 20.

EXAMPLE 23

By use of an alumina ceramic plate as a substrate, a heat-generating resistance layer which is a functional thin film was formed on the surface of the substrate. Deposition of the heat-generating resistance layer was carried out according to the sputtering method by use of a device shown in FIG. 3. As the target for sputtering, a graphite having a purity of 99.9% or higher was employed, and as the starting gases, $CF_4/Ar = 0.5$ (volume ratio) and $SiH_4/Ar = 0.1$ (volume ratio) were employed. The conditions during deposition are as shown in Table 5. The gas pressure in the deposition chamber during sputtering was $4 \times 10^{-2}$ Torr. During deposition, the degrees of opening of the respective valves and other conditions were maintained constant, and the heat-generating resistance layer with a thickness shown in Table 5 was formed.

By use of the thus prepared resistance layer, heat-generating resistance elements were prepared and further electrical pulse signal was inputted therein in the same manner as in Example 19, they were confirmed to be excellent in durability similarly as in Example 19.

TABLE 5

| Example No. | Starting material | Gas flow rate (SCCM) | Discharging power (W/cm²) | Substrate temperature (°C.) | Film thickness (Å) |
|---|---|---|---|---|---|
| 19 | $CF_4/Ar = 0.5$ | 50 | 0.8 | 350 | 3000 |
|  | $SiH_4/Ar = 0.1$ | 5 |  |  |  |
| 20 | $C_2F_6/Ar = 0.5$ | 50 | 0.8 | 350 | 3000 |
|  | $Si_2H_6/Ar = 0.1$ | 2 |  |  |  |
| 21 | $CF_4/Ar = 0.5$ | 50 | 0.8 | 350 | 3000 |
|  | $SiH_4/Ar = 0.1$ | 5 |  |  |  |
| 22 | $C_2F_6/Ar = 0.5$ | 50 | 0.8 | 350 | 3000 |
|  | $Si_2H_6/Ar = 0.1$ | 2 |  |  |  |

TABLE 5-continued

| Example No. | Starting material | Gas flow rate (SCCM) | Discharging power (W/cm²) | Substrate temperature (°C.) | Film thickness (Å) |
|---|---|---|---|---|---|
| 23 | $CF_4/Ar = 0.5$ | 15 | 5 | 350 | 3000 |
|  | $SiH_4/Ar = 0.1$ | 2 |  |  |  |

EXAMPLE 24

A heat-generating resistance layer with a thickness as shown in Table 6 was prepared in the same manner as in Example 19 except for using $CF_4/Ar = 0.5$ (volume ratio) and $SiH_4/Ar = 0.8$ (volume ratio) as the starting gases under the conditions as shown in Table 6 during deposition and changing the flow rate of $SiH_4/Ar$ gas by changing continuously the degree of opening of the valve during deposition. Also, heat-generating resistance elements were prepared by use of this heat-generating resistance layer in the same manner as in Example 19.

Electric resistance of each heat-generating element thus obtained was measured to be 85 ohm.

Also, durability of the heat-generating resistance elements was measured by inputting electrical pulse signals into the heat-generating resistance elements obtained according to this Example. For the electrical pulse signal, its duty was made 50%, applied voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 25

A heat-generating resistance layer with the same thickness was deposited in the same manner as in Example 24 except for maintaining the $SiH_4/Ar$ gas flow rate constant and changing continuously the discharging power.

Next, when heat-generating resistance elements were prepared and electrical pulse signal was inputted therein in the same manner as in Example 24, the heat-generating resistance elements were not destroyed even when the number of electrical pulse signal inputting reached $1 \times 10^{10}$ times. Also, no change in resistance value was recognized.

TABLE 6

| Example No. | Starting material | Gas flow rate (SCCM) | Discharging power (W/cm²) | Substrate temperature (°C.) | Film thickness (Å) |
|---|---|---|---|---|---|
| 24 | $CF_4/Ar = 0.5$ | 50 | 0.8 | 350 | 3000 |
|  | $SiH_4/Ar = 0.8$ | 5 → 2 |  |  |  |
| 25 | $CF_4/Ar = 0.5$ | 50 | 0.8 → 0.9 | 350 | 3000 |
|  | $SiH_4/Ar = 0.8$ | 5 |  |  |  |

EXAMPLE 26

A heat-generating resistance layer and heat-generating resistance elements were prepared in the same manner as in Example 1 except for hanging $H_2$ of the starting gases in Example 1 to $GeH_4/Ar=0.1$ (volume ratio) and changing the conditions during deposition as shown in Table 7.

Electric resistance of each heat-generating element thus obtained was measured to be 80 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 27

A heat-generating resistance layer with the same thickness was deposited in the same manner as Example 26 except for changing the starting gases to $C_2F_6/Ar=0.5$ (volume ratio) and $GeH_4/Ar=0.1$ ppm (volume ratio).

Next, when heat-generating resistance elements were prepared and electrical pulse signal was inputted therein in the same manner as in Example 26, the heat-generating resistance elements were not destroyed even when the number of electrical pulse signal inputting reached $1 \times 10^{10}$ times. Also, no change in resistance value was recognized.

EXAMPLE 28

Heat-generating resistance elements were prepared by depositing a heat-generating resistance layer in the same manner as in Example 26 except for changing the substrate to #7059 glass.

When the thus obtained heat-generating resistance elements were driven in the same manner as in Example 26, it was confirmed that they had satisfactory durability similarly as Example 26.

EXAMPLE 29

Heat-generating resistance elements were prepared by depositing a heat-generating resistance layer in the same manner as in Example 27 except for changing the substrate to #7059 glass.

When the thus obtained heat-generating resistance elements were driven in the same manner as in Example 27, it was confirmed that they had satisfactory durability similarly as in Example 27.

TABLE 7

| Example No. | Starting material | Gas flow rate (SCCM) | Discharging power (W/cm²) | Substrate temperature (°C.) | Film thickness (Å) |
|---|---|---|---|---|---|
| 26 | $CF_4/Ar = 0.5$ | 50 | 0.8 | 350 | 3000 |
|  | $GeH_4/Ar = 0.1$ | 5 |  |  |  |
| 27 | $C_2F_6/Ar = 0.5$ | 50 | 0.8 | 350 | 3000 |
|  | $GeH_4/Ar = 0.1$ | 5 |  |  |  |
| 28 | $CF_4/Ar = 0.5$ | 50 | 0.8 | 350 | 3000 |
|  | $GeH_4/Ar = 0.1$ | 5 |  |  |  |
| 29 | $C_2F_6/Ar = 0.5$ | 50 | 0.8 | 350 | 3000 |
|  | $GeH_4/Ar = 0.1$ | 5 |  |  |  |

EXAMPLE 30

A heat-generating resistance layer with a thickness as shown in Table 8 was prepared in the same manner as in Example 26 except for using the conditions as shown in Table 8 during deposition and changing the flow rate of $GeH_4/Ar$ gas by changing continuously the degree of opening of the valve during deposition. Also, heat-generating resistance elements were prepared by use of this heat-generating resistance layer in the same manner as Example 1.

Electric resistance of each heat-generating element thus obtained was measured to be 85 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 31

A heat-generating resistance layer with the same thickness was deposited in the same manner as Example 30 except for changing the starting gases to $C_2F_6/Ar=0.5$ (volume ratio) and $GeH_4/Ar=0.1$ (volume ratio).

Next, when heat-generating resistance elements were prepared and electrical pulse signal was inputted therein in the same manner as in Example 30, the heat-generating resistance elements were not destroyed even when the number of electrical pulse signal inputting reached $1 \times 10^{10}$ times. Also, no change in resistance value was recognized.

EXAMPLE 32

A heat-generating resistance layer with the same thickness was deposited in the same manner as in Example 30 except for maintaining the $GeH_4/Ar$ gas flow rate constant and changing continuously the discharging power.

When the thus obtained heat-generating resistance elements were driven in the same manner as in Example 30, it was confirmed that they had satisfactory durability similarly as in Example 30.

EXAMPLE 33

A heat-generating resistance layer with the same thickness was deposited in the same manner as in Example 31 except for maintaining the GeH$_4$/Ar gas flow rate constant and changing continuously the discharging power.

When the thus obtained heat-generating resistance elements were driven in the same manner as in Example 31, it was confirmed that they had satisfactory durability similarly as in Example 31.

TABLE 8

| Example No. | Starting material | Gas flow rate (SCCM) | Discharging power (W/cm$^2$) | Substrate temperature (°C.) | Film thickness (Å) |
|---|---|---|---|---|---|
| 30 | CF$_4$/Ar = 0.5 | 50 | 0.8 | 350 | 3000 |
|  | GeH$_4$/Ar = 0.1 | 5 → 2 | | | |
| 31 | C$_2$F$_6$/Ar = 0.5 | 50 | 0.8 | 350 | 3000 |
|  | GeH$_4$/Ar = 0.1 | 5 → 2 | | | |
| 32 | CF$_4$/Ar = 0.5 | 50 | 0.8 → 0.9 | 350 | 3000 |
|  | GeH$_4$/Ar = 0.1 | 5 | | | |
| 33 | C$_2$F$_6$/Ar = 0.5 | 50 | 0.8 → 0.9 | 350 | 3000 |
|  | GeH$_4$/Ar = 0.1 | 5 | | | |

EXAMPLE 34

A heat-generating resistance layer with a thickness as shown in Table 9 was prepared in the same manner as in Example 1 except for using CH$_4$/Ar=0.5 (volume ratio), SiH$_4$/Ar=0.1 (volume ratio) and GeF$_4$/Ar=0.05 (volume ratio) as the starting gases under the conditions as shown in Table 9 during deposition and maintaining the openings of the respective valves and other conditions during deposition, and heat-generating resistance elements were prepared by use of this heat-generating resistance layer in the same manner as in Example 1.

Electric resistance of each heat-generating element thus obtained was measured to be 80 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1 \times 10^{10}$ times in every case of driving at different driving frequencies, and their resistance values were substantially unchanged.

EXAMPLE 35

A heat-generating resistance layer with the same thickness was deposited in the same manner as in Example 1 except for changing the starting gases to CH$_4$/Ar=0.5 (volume ratio) and SiF$_4$/Ar=0.1 (volume ratio) and GeH$_4$/Ar=0.05 (volume ratio).

Next, when heat-generating resistance elements were prepared and electrical pulse signal was inputted therein in the same manner as Example 34, the heat-generating resistance elements were not destroyed even when the number of electrical pulse signal inputting reached $1 \times 10^{10}$ times. Also, no change in resistance value was recognized.

EXAMPLE 36

Heat-generating resistance elements were prepared by depositing a heat-generating resistance layer in the same manner as in Example 34 except for changing the substrate to #7059 glass.

When the thus obtained heat-generating resistance elements were driven in the same manner as in Example 34, it was confirmed that they had satisfactory durability similarly as in Example 34.

EXAMPLE 37

Heat-generating resistance device was prepared by depositing a heat-generating resistance layer in the same manner as in Example 35 except for changing the substrate to #7059 glass.

When the thus obtained heat-generating resistance elements were driven in the same manner as in Example 35, it was confirmed that they had satisfactory durability similarly as in Example 35.

TABLE 9

| Example No. | Starting material | Gas flow rate (SCCM) | Discharging power (W/cm$^2$) | Substrate temperature (°C.) | Film thickness (Å) |
|---|---|---|---|---|---|
| 34 | CH$_4$/Ar = 0.5 | 50 | 0.8 | 350 | 3000 |
|  | SiH$_4$/Ar = 0.1 | 5 | | | |
|  | GeF$_4$/Ar = 0.05 | 5 | | | |
| 35 | CH$_4$/Ar = 0.5 | 50 | 0.8 | 350 | 3000 |
|  | SiF$_4$/Ar = 0.1 | 5 | | | |
|  | GeH$_4$/Ar = 0.05 | 5 | | | |
| 36 | CH$_4$/Ar = 0.5 | 50 | 0.8 | 350 | 3000 |
|  | SiH$_4$/Ar = 0.1 | 5 | | | |
|  | GeF$_4$/Ar = 0.05 | 5 | | | |
| 37 | CH$_4$/Ar = 0.5 | 50 | 0.8 | 350 | 3000 |
|  | SiF$_4$/Ar = 0.1 | 5 | | | |
|  | GeH$_4$/Ar = 0.05 | 5 | | | |

EXAMPLE 38

A heat-generating resistance layer was prepared in the same manner as in Example 34 except for using the conditions as shown in Table 10 during deposition and changing the flow rate of SiH$_4$/Ar gas and the flow rate of GeF$_4$/Ar gas by changing continuously the degree of opening of the valve during deposition, and, heat-generating resistance elements were prepared by use of this heat-generating resistance layer in the same manner as in Example 34.

Electric resistance of each heat-generating element thus obtained was measured to be 85 ohm.

Also, durability of the heat-generating resistance elements was measured by inputting electrical pulse signals into the heat-generating resistance elements obtained according to this Example. For the electrical pulse signal, its duty was made 50%, application voltage 20 V and the driving frequencies 0.5 kHz, 1.0 kHz and 2.0 kHz.

As a result, the heat-generating resistance elements were not destroyed even when the number of electrical pulse signal inputting reached $1\times10^{10}$ times in every case of driving at different driving frequencies, and their resistance values were substantially unchanged.

EXAMPLE 39

A heat-generating resistance layer with the same thickness was deposited in the same manner as in Example 38 except for changing the starting gases to CH$_4$/Ar=0.5 (volume ratio), SiF$_4$/Ar=0.1 (volume ratio) and GeH$_4$/Ar=0.05 (volume ratio).

Next, when heat-generating resistance elements were prepared and electrical pulse signal was inputted therein in the same manner as in Example 38, the heat-generating resistance elements were not destroyed even when the number of electrical pulse signal inputting reached $1\times10^{10}$ times. Also, no change in resistance value was recognized.

EXAMPLE 40

A heat-generating resistance layer with the same thickness was deposited in the same manner as in Example 38 except for maintaining SiH$_4$/Ar gas flow rate and GeF$_4$/Ar gas flow rate constant and changing continuously the discharging power.

When the thus obtained heat-generating resistance elements were driven in the same manner as in Example 38, it was confirmed that they had satisfactory durability similarly as in Example 38.

EXAMPLE 41

A heat-generating resistance layer with the same thickness was deposited in the same manner as in Example 39 except for maintaining SiF$_4$/Ar gas flow rate and GeH$_4$/Ar gas flow rate constant and changing continuously the discharging power.

When the thus obtained heat-generating resistance elements were driven in the same manner as in Example 39, it was confirmed that they had satisfactory durability similarly as in Example 39.

TABLE 10

| Example No. | Starting material | Gas flow rate (SCCM) | Discharging power (W/cm$^2$) | Substrate temperature (°C.) | Film thickness (Å) |
|---|---|---|---|---|---|
| 38 | CH$_4$/Ar = 0.5 | 50 | 0.8 | 350 | 3000 |
|  | SiH$_4$/Ar = 0.1 | 5 → 2 |  |  |  |
|  | GeF$_4$/Ar = 0.05 | 5 → 2 |  |  |  |
| 39 | CH$_4$/Ar = 0.5 | 50 | 0.8 | 350 | 3000 |
|  | SiF$_4$/Ar = 0.1 | 5 → 2 |  |  |  |
|  | GeH$_4$/Ar = 0.05 | 5 → 2 |  |  |  |
| 40 | CH$_4$/Ar = 0.5 | 50 | 0.8 → 0.9 | 350 | 3000 |
|  | SiH$_4$/Ar = 0.1 | 5 |  |  |  |
|  | GeF$_4$/Ar = 0.05 | 5 |  |  |  |
| 41 | CH$_4$/Ar = 0.5 | 50 | 0.8 → 0.9 | 350 | 3000 |
|  | SiF$_4$/Ar = 0.1 | 5 |  |  |  |
|  | GeH$_4$/Ar = 0.05 | 5 |  |  |  |

We claim:

1. A heat-generating resistor, having a functional thin film comprising an amorphous material containing halogen atoms and hydrogen atoms in a matrix of carbon atoms formed on a substrate, wherein said halogen atoms and/or hydrogen atoms are distributed nonuniformly in the film thickness direction in said functional thin film.

2. A heat-generating resistor according to claim 1, wherein said functional thin film further contains silicon atoms distributed nonuniformly in the film thickness direction in said functional thin film.

3. A heat-generating resistor according to claim 1, wherein said functional thin film further contains germanium atoms distributed nonuniformly in the film thickness direction in said functional thin film.

4. A heat-generating resistor according to claim 1, wherein said functional thin film further contains silicon atoms and germanium atoms distributed nonuniformly in the film thickness direction in said functional thin film.

5. A heat-generating resistor according to claim 1, wherein said functional thin film further contains a substance for controlling electroconductivity distributed nonuniformly in the film thickness direction in said functional thin film.

6. A heat-generating resistor according to claim 2, wherein said functional thin film further contains a substance for controlling electroconductivity distributed nonuniformly in the film thickness direction in said functional thin film.

7. A heat-generating resistor according to claim 3, wherein said functional thin film further contains a substance for controlling electroconductivity distributed nonuniformly in the film thickness direction in said functional thin film.

8. A heat-generating resistor according to claim 4, wherein said functional thin film further contains a substance for controlling electroconductivity distributed nonuniformly in the film thickness direction in said functional thin film.

9. A heat-generating resistor according to any one of claims 1, 2, 3, 4 and 5, wherein the content of halogen atoms in said functional thin film is 0.0001 to 30 atomic %.

10. A heat-generating resistor according to any one of claims 1, 2, 3, 4 and 5, wherein the content of hydrogen atoms in said functional thin film is 0.0001 to 30 atomic %.

11. A heat-generating resistor according to any one of claims 1 and 5, wherein the sum of the content of halogen atoms and the content of hydrogen atoms in said functional thin film is 0.0001 to 40 atomic %.

12. A heat-generating resistor according to claim 2, wherein the sum of the content of silicon atoms, the content of halogen atoms and the content of hydrogen atoms in said functional thin film is 0.0001 to 40 atomic %.

13. A heat-generating resistor according to claim 3, wherein the sum of the content of germanium atoms, the content of halogen atoms and the content of hydrogen atoms in said functional thin film is 0.0001 to 40 atomic %.

14. A heat-generating resistor according to claim 4, wherein the sum of the content of silicon atoms, the content of germanium atoms, the content of halogen atoms and the content of hydrogen atoms in said functional thin film is 0.0001 to 40 atomic %.

15. A heat-generating resistor according to any one of claims 1, 2, 3, 4 and 5, wherein halogen atoms are F or Cl.

16. A heat-generating resistor according to any one of claims 1, 2, 3, 4 and 5, wherein the substrate has a surface layer comprising an amorphous material having a matrix of carbon atoms on the side on which said functional thin film is formed.

17. A heat-generating resistor according to any one of claims 5, 6, 7 and 8, wherein the content of the substance for controlling electroconductivity in said functional thin film is 0.01 to 50,000 atomic ppm.

18. A heat-generating resistor according to any one of claims 5, 6, 7 and 8, wherein the substance for controlling electroconductivity is an atom belonging to the group III of the periodic table.

19. A heat generating resistor according to any one of claims 5, 6, 7 and 8, wherein the substance for controlling electroconductivity is an atom belonging to the group V of the periodic table.

20. A heat generating resistor according to any one of claims 2 and 4, wherein the content of silicon atoms in said functional thin film is 0.0001 to 40 atomic %.

21. A heat generating resistor according to any one of claims 3 and 4, wherein the content of germanium atoms in said functional thin film is 0.0001 to 40 atomic %.

22. A heat-generating resistance element comprising the heat-generating resistor of claim 1 and a pair of electrodes electrically connected to the heat-generating resistor.

23. A heat-generating resistance element comprising the heat-generating resistor of claim 2 and a pair of electrodes electrically connected to the heat-generating resistor.

24. A heat-generating resistance element comprising the heat-generating resistor of claim 3 and a pair of electrodes electrically connected to the heat-generating resistor.

25. A heat-generating resistance element comprising the heat-generating resistor of claim 4 and a pair of electrodes electrically connected to the heating-generating resistor.

26. A heat-generating resistance element comprising the heat-generating resistor of claim 5 and a pair of electrodes electrically connected to the heat-generating resistor.

27. A heat-generating resistance element comprising the heat-generating resistor of claim 6 and a pair of electrodes electrically connected to the heat-generating resistor.

28. A heat-generating resistance element comprising the heat-generating resistor of claim 7 and a pair of electrodes electrically connected to the heat-generating resistor.

29. A heat-generating resistance element comprising the heat-generating resistor of claim 8 and a pair of electrodes electrically connected to the heat-generating resistor.

* * * * *

UNITED STATES PATENT AND TRADEMARK OFFICE
CERTIFICATE OF CORRECTION

PATENT NO. : 4,783,369

DATED : November 8, 1988

INVENTOR(S) : MASAO SUGATA, ET AL.

Page 1 of 4

It is certified that error appears in the above-identified patent and that said Letters Patent is hereby corrected as shown below:

Title page:

IN [57] ABSTRACT

Line 1, "heat generating" should read --heat-generating--.

COLUMN 1

Line 62, "Further" should read --A further--.

COLUMN 2

Line 24, "FIG. 2" should read --Figure, 2--.

COLUMN 3

Line 19, "is" should read --in--.

COLUMN 4

Line 68, "methylacethylene ($C_3H_4$)," should read --methylacetylene ($C_3H_4$),--.

COLUMN 5

Line 48, "aimed" should read --desired--.

UNITED STATES PATENT AND TRADEMARK OFFICE
CERTIFICATE OF CORRECTION

PATENT NO. : 4,783,369
DATED : November 8, 1988
INVENTOR(S) : MASAO SUGATA, ET AL.

It is certified that error appears in the above-identified patent and that said Letters Patent is hereby corrected as shown below:

COLUMN 6

Line 37, "1102" should read --gas bomb 1102--.
Line 39, "1103" should read --gas bomb 1103--.
Line 41, "1104" should read --gas bomb 1104--.
Line 42, "1105" should read --gas bomb 1105--.

COLUMN 7

Line 23, "rtte" should read --rate--.

COLUMN 8

Line 47, "an" should read --and--.

COLUMN 10

Line 1, "a pressure" should read --a desired pressure--.
Line 2, "valve 1134" should read --main valve 1134--.
Line 7, "nonuniformly," should read --nonuniform,--.
Line 16, "so called" should read --so-called--.

COLUMN 11

Line 24, "he" should read --the--.

UNITED STATES PATENT AND TRADEMARK OFFICE
CERTIFICATE OF CORRECTION

PATENT NO. : 4,783,369
DATED : November 8, 1988
INVENTOR(S) : MASAO SUGATA, ET AL.          Page 3 of 4

It is certified that error appears in the above-identified patent and that said Letters Patent is hereby corrected as shown below:

COLUMN 12

Line 54, "1102" should read --gas bomb 1102--.
    Line 58, "1104" should read --gas bomb 1104--.

COLUMN 15

Line 28, "a HF" should read --an HF--.
    Line 31, "electrode pair" should read --electrode pairs--.
    Line 32, "heatgenerating" should read --heat-generating--.
    Line 62, "element" should read --elements--.
    Line 65, "element" should read --elements--.

COLUMN 16

Line 19, "element" should read --elements--.

COLUMN 19

Line 55, "B=1000 ppm" should read --$B_2H_6/Ar=1000$ ppm--.

COLUMN 23

Line 5, "hanging" should read --changing--.

COLUMN 26

Line 13, "device was" should read --elements were--.

UNITED STATES PATENT AND TRADEMARK OFFICE
CERTIFICATE OF CORRECTION

PATENT NO. : 4,783,369

DATED : November 8, 1988

INVENTOR(S) : MASAO SUGATA, ET AL.

Page 4 of 4

It is certified that error appears in the above-identified patent and that said Letters Patent is hereby corrected as shown below:

COLUMN 29

Line 15, "heat generating" should read --heat-generating--.
    Line 19, "heat generating" should read --heat-generating--.
    Line 22, "heat generating" should read --heat-generating--.

COLUMN 30

Line 11, "heating-" should read --heat- --.

Signed and Sealed this

Twentieth Day of March, 1990

Attest:

JEFFREY M. SAMUELS

Attesting Officer

Acting Commissioner of Patents and Trademarks